United States Patent
Goldblatt et al.

(10) Patent No.: US 12,261,577 B2
(45) Date of Patent: Mar. 25, 2025

(54) AMPLIFIER PEAK DETECTION

(71) Applicant: QUALCOMM Incorporated, San Diego, CA (US)

(72) Inventors: Jeremy Goldblatt, Encinitas, CA (US); Arul Balasubramaniyan, Plano, TX (US); Chinmaya Mishra, San Diego, CA (US); Damin Cao, San Diego, CA (US); Bhushan Shanti Asuri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 873 days.

(21) Appl. No.: 17/356,424

(22) Filed: Jun. 23, 2021

(65) Prior Publication Data

US 2022/0416737 A1    Dec. 29, 2022

(51) Int. Cl.
*H03F 3/24*    (2006.01)
*G01R 19/04*    (2006.01)
*H03F 1/02*    (2006.01)
*H03F 3/195*    (2006.01)
(Continued)

(52) U.S. Cl.
CPC .............. *H03F 3/245* (2013.01); *G01R 19/04* (2013.01); *H03F 1/0238* (2013.01); *H03F 3/195* (2013.01); *H03G 3/3042* (2013.01); *H04B 1/0475* (2013.01); *H03F 2200/435* (2013.01); *H03F 2200/451* (2013.01); *H03F 2200/474* (2013.01); *H04B 2001/0416* (2013.01)

(58) Field of Classification Search
CPC ........ H03F 3/245; H03F 1/0238; H03F 3/195; G01R 19/04; H03G 3/3042
See application file for complete search history.

(56) References Cited

U.S. PATENT DOCUMENTS

| | | | | |
|---|---|---|---|---|
| 5,381,146 A | * | 1/1995 | Kolte | H03K 5/082 341/122 |
| 6,522,160 B1 | * | 2/2003 | Zivanovic | H03K 5/082 327/72 |
| 6,525,611 B1 | | 2/2003 | Dening et al. | |

(Continued)

FOREIGN PATENT DOCUMENTS

| | | |
|---|---|---|
| EP | 3252496 A1 | 12/2017 |
| EP | 3267579 A1 | 1/2018 |

(Continued)

OTHER PUBLICATIONS

International Search Report and Written Opinion—PCT/US2022/031204—ISA/EPO—Nov. 23, 2022.

(Continued)

*Primary Examiner* — Patricia T Nguyen
(74) *Attorney, Agent, or Firm* — Haynes and Boone, LLP/Qualcomm Incorporated

(57) ABSTRACT

A peak detector for a power amplifier is provided that includes a threshold voltage detector configured to pulse a detection current in response to an amplified output signal from the amplifier exceeding a peak threshold. A plurality of such peak detectors may be integrated with a corresponding plurality of power amplifiers in a transmitter. Should any peak detector assert an alarm signal or more than a threshold number of alarm signals during a given period, a controller reduces a gain for the plurality of power amplifiers.

24 Claims, 4 Drawing Sheets

(51) Int. Cl.
*H03G 3/30* (2006.01)
*H04B 1/04* (2006.01)

(56) References Cited

U.S. PATENT DOCUMENTS

| | | | |
|---|---|---|---|
| 7,157,944 B1 * | 1/2007 | Wang | G01R 19/10 |
| | | | 327/58 |
| 11,689,174 B2 * | 6/2023 | Zhan | H03H 7/0115 |
| | | | 375/219 |
| 2008/0112711 A1 * | 5/2008 | Inoue | H03F 3/45928 |
| | | | 330/306 |
| 2009/0134913 A1 | 5/2009 | Hsiung et al. | |
| 2011/0043956 A1 | 2/2011 | Su et al. | |
| 2011/0080214 A1 * | 4/2011 | Tsuchi | G09G 3/3688 |
| | | | 330/69 |
| 2012/0294398 A1 | 11/2012 | Yucek et al. | |
| 2013/0342274 A1 | 12/2013 | Coban et al. | |
| 2019/0245501 A1 | 8/2019 | Dinc et al. | |

FOREIGN PATENT DOCUMENTS

| | | |
|---|---|---|
| GB | 2463884 A | 3/2010 |
| WO | 2016126368 A1 | 8/2016 |

OTHER PUBLICATIONS

Partial International Search Report—PCT/US2022/031204—ISA/EPO—Aug. 5, 2022.

* cited by examiner

AMPLIFIER PEAK DETECTION

TECHNICAL FIELD

The present invention relates to amplifiers, and more particularly, to peak detection for amplifiers.

BACKGROUND

A number of factors affect power amplifier reliability. For example, the spectrally-efficient modulation schemes in communication protocols such as 5G result in a high peak-to-average ratio (PAR) that may strain a power amplifier. In addition, conventional antenna modules may present a high voltage standing wave ratio (VSWR) to a power amplifier that also degrades reliability. Moreover, it is conventional to construct a power amplifier in a radio frequency (RF) transmitter using thin-oxide transistors (core devices) to provide better conductivity and fidelity at higher frequencies such as in the millimeter wave spectrum. Although core devices enhance the high-frequency performance, thin-oxide transistors are more readily damaged such as through gate-oxide break down and other reliability effects.

To enhance power amplifier reliability, various power amplifier protection systems have thus been developed. But existing power amplifier protection systems often struggle at providing an adequate response time, reduced complexity and power consumption, and minimal loading on the power amplifier.

SUMMARY

In accordance with an aspect of the disclosure, a peak detector is provided that includes: a voltage divider configured to divide an amplifier output signal into a divided signal; a threshold voltage detector configured to conduct a detection current in response to the divided signal being greater than a threshold voltage; a current mirror configured to mirror the detection current into a mirrored current and configured to drive the mirrored current into a node; and at least one inverter configured to invert a voltage of the node to produce a binary output signal In accordance with another aspect of the disclosure, a peak detection method is provided that includes: dividing an amplifier output signal to form a divided signal; conducting a detection current in response to the divided signal being greater than a threshold voltage; mirroring the detection current into a mirrored current driven into a node; and asserting a binary output signal in response to a voltage of the node exceeding a trip voltage.

In accordance with yet another aspect of the disclosure, a transmitter is provided that includes: a plurality of antennas; a plurality of power amplifiers corresponding to the plurality of antennas, each power amplifier configured to drive a respective one of the antennas with an amplified RF output signal a plurality of power amplifiers corresponding to the plurality of antennas, each power amplifier configured to drive a respective one of the antennas with an amplified RF output signal; a plurality of peak detectors corresponding to the plurality of power amplifiers, each peak detector being configured to generate an alarm signal in response to the corresponding power amplifier's amplified RF output signal being greater than a peak threshold; and a controller configured to reduce a gain for at least one of the power amplifiers responsive to an assertion of any of the alarm signals.

These and additional advantageous features of the disclosed embodiments may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
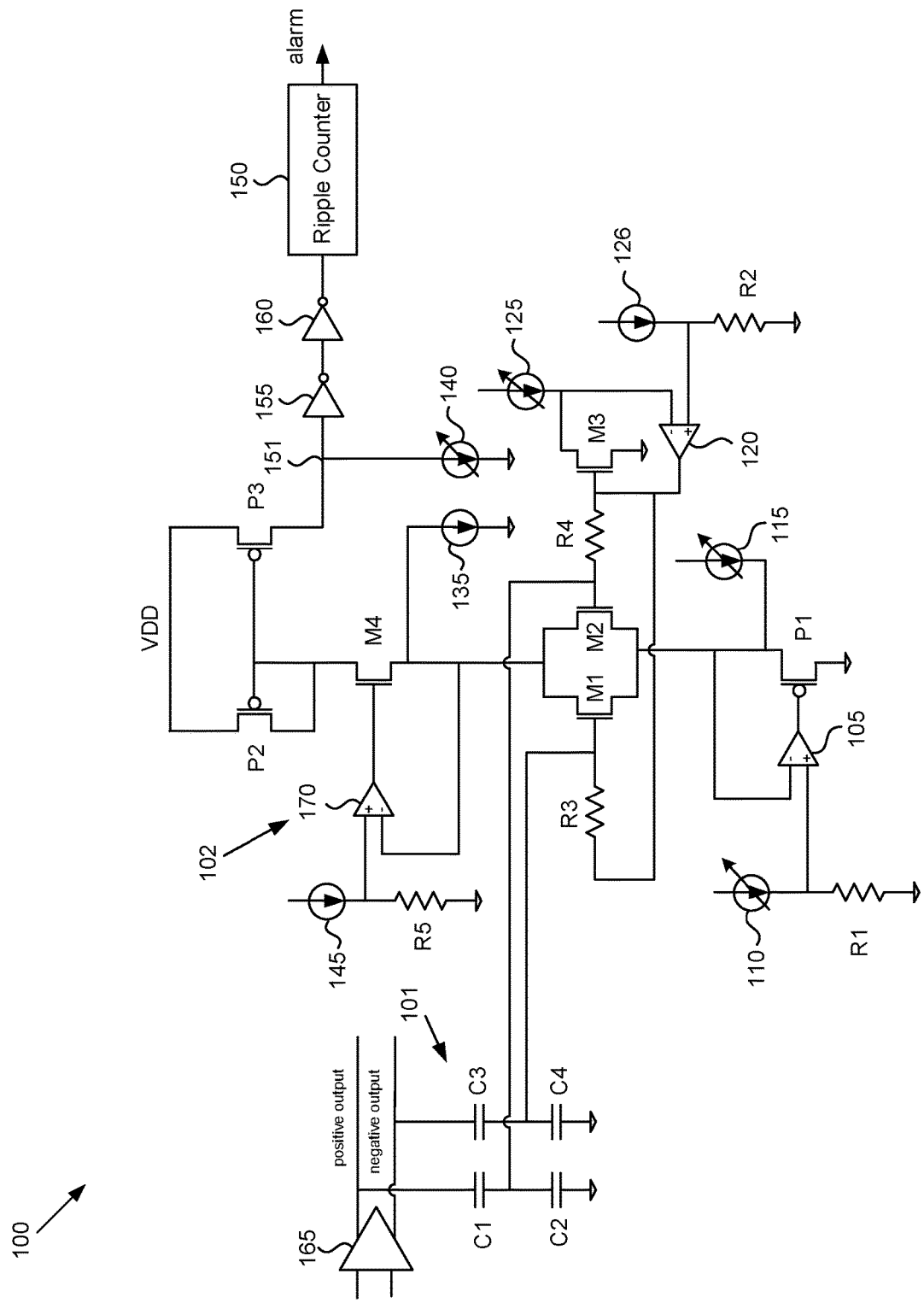
FIG. 1 is a circuit diagram of a peak detector in accordance with an aspect of the disclosure.

An improved peak detector is provided for an amplifier protection system. The following discussion will assume that the amplifier being protected is a power amplifier in a transmitter, but it will be appreciated that other types of amplifiers may also benefit from the peak detector disclosed herein. The peak detector includes a voltage divider that functions to divide a power amplifier output signal into a divided signal. For example, the voltage divider may be a capacitive voltage divider that advantageously imposes relatively little loading on the amplifier and may be coupled to an output of the amplifier such as to a drain (or drains in differential embodiments) of a transistor (or transistors) which implement the amplification. In addition, the peak detector includes a threshold voltage detector that conducts or pulses a detection current in response to the divided signal being greater than a threshold voltage. The peak detector also includes a current mirror that mirrors the detection current into a mirrored current driven into a node. Finally, the peak detector includes at least one inverter configured to invert a voltage of the node to produce a binary output signal.

Should the divided signal as derived from the power amplifier output signal not exceed the threshold voltage, the threshold voltage detector conducts virtually no current. The threshold voltage detector thus pulses the detection current only in response to the divided signal exceeding the threshold voltage, which advantageously reduces power consumption. In addition, the response time of the threshold voltage detector is relatively fast so that the amplifier protection system may adjust the power amplifier gain relatively quickly before damage occurs to the power amplifier. The threshold voltage detector may be readily integrated with the power amplifier using core devices (thin-oxide transistors).

To increase robustness against noise causing a false peak detection, the peak detector may include a counter that counts the number of times that the binary output signal is asserted within a reset period. If the count exceeds a threshold count before the count is reset at the end of the reset period, the counter asserts a peak detection alarm signal. The amplifier protection system may then respond to an assertion of the peak detection alarm signal by reducing a gain of the power amplifier. Alternatively, the amplifier protection system may respond to an assertion of the binary output signal in implementations without a counter by reducing the gain of the power amplifier.

In a beamforming transmitter, the transmitter will include multiple power amplifiers, each power amplifier driving its own antenna or sub-array of antennas. Each power amplifier may be associated with its own peak detector generating its own peak detection alarm signal. The amplifier protection system may then respond to an assertion of any of the peak detection alarm signals (or the binary output signals in implementations without counters) by reducing a gain for all the power amplifiers. This is advantageous regarding a protection of the power amplifiers without disturbing beamforming and/or beamsteering combined with the beamforming.

An example peak detector 100 is shown in FIG. 1 for a differential power amplifier 165. A capacitive voltage divider 101 includes a serial combination of a capacitor C1 and C2 that is coupled between a positive output of the differential power amplifier 165 and ground. Similarly, capacitive voltage divider 101 includes a serial combination of another set of capacitors C3 and C4 that is coupled between a negative output of the differential power amplifier 165 and ground. Capacitors C1 and C3 may be equal to each other. Similarly, capacitors C2 and C4 may be the same. For a single-ended power amplifier implementation, capacitive voltage divider 101 may include just one serial combination of capacitors. A node between capacitors C1 and C2 provides a divided version of the positive output signal whereas a node between capacitors C3 and C4 provides a divided version of the negative output signal. Note that the designations of "positive" and "negative" for a differential output signal is arbitrary as what is positive and negative will reverse roles depending upon the timing of the signal sampling. Capacitor C1 may be directly connected to a drain of a first transistor that implements an amplification function of power amplifier 165. Similarly, capacitor C3 may be directly connected to a drain of a second transistor that implements an amplification function of power amplifier 165. Other configurations for capacitive voltage divider 101 are possible.

To respond to the divided versions of the positive and negative output signals, a threshold voltage detector 102 includes a pair of matched transistors M1 and M2 having their sources connected together and having their drains connected together. The divided version of the positive output signal drives the gate of transistor M1 whereas the divided version of the negative output signal drives the gate of transistor M2. To respond to the power amplifier output signals exceeding a peak threshold with an appropriate amount of pulsed current, threshold voltage detector 102 biases a source voltage, a gate voltage, and a drain voltage for transistors M1 and M2. Some example circuits for this biasing will now be discussed.

A source voltage bias for transistors M1 and M2 in threshold voltage detector 102 is provided by source bias circuit formed by a PMOS transistor P1, a differential amplifier 105, a variable current source 115, a variable current source 110, and resistor R1. A controller (not illustrated) controls variable current source 110 to drive resistor R1 so as to produce a corresponding voltage at a terminal for resistor R1. This voltage at the resistor terminal is received at one input of the differential amplifier 105. An output of the differential amplifier 105 drives a gate of transistor P1, which has a drain connected to ground and a source connected to the sources of transistors M1 and M2. The source of transistor P1 also couples to another input of differential amplifier 105. A variable current source 115 drives a current into transistor P1 (e.g., into a source of transistor P1) so that during operation of peak detector 100, feedback through differential amplifier 105 will function to keep the source voltage of transistor P1 (and hence the source voltage of transistors M1 and M2) equal to the voltage across resistor R1. The source voltage of transistors M1 and M2 may thus be controlled by the current setting of variable current source 110. It will be appreciated that variable current sources 110 and 115 may be fixed current sources in alternative implementations.

Threshold voltage detector 102 biases the gate voltages for transistors M1 and M2 using a gate bias circuit formed by an NMOS transistor M3, a variable current source 125, a differential amplifier 120, a variable current source 126, and resistors R2, R3, and R4. Resistor R2 connects between ground and an output of variable current source 126. Resistor R2 may be matched to resistor R1 so that if variable current source 126 is controlled to output the same amount of current as variable current source 110, the voltages across resistors R1 and R2 are equal. Since the voltage across resistor R1 is the source voltage for transistors M1 and M2, the voltage across resistor R2 is also equal to the source voltage for transistors M1 and M2 for implementations in which the voltages across resistors R1 and R2 are equal. The voltage across resistor R2 is received at a first input of differential amplifier 120. An output of differential amplifier 120 drives a gate of transistor M3, which is matched to transistors M1 and M2. Transistor M3 has its source connected to ground and a drain connected to a second input of differential amplifier 120. Current source 125 drives a biasing current into the drain of transistor M3. In implementations in which resistors R1 and R2 are matched and driven with the same amount of current, the voltage across resistor R2 is equal to the source voltage of transistors M1 and M2. Feedback through differential amplifier 120 will thus force the drain voltage of transistor M3 to equal the source voltages of transistors M1 and M2 in such implementations. The output of differential amplifier 120 connects to the gate of transistor M2 through resistor R4 and to the gate of transistor M1 through resistor R3. Resistor R3 may be matched to resistor R4 so that the bias to the gate voltages of transistor M1 and M2 are equal. This gate bias voltage equals the gate voltage of transistor M3. The gate bias voltage will be less than the source voltage of transistors M1 and M2 so that in a default state, transistors M1 and M2 are not conducting as the transistor threshold voltage is not satisfied. The gate-to-source bias of transistors M1 and M2 will depend upon the resistances of resistors R1 and R2 as well as the output currents of current sources 110, 125, and 126 and will vary in different implementations. In an example implementation, the gate voltage bias may be approximately 0.36 V whereas the source voltage is approximately 0.5V. The gate-to-source bias voltage for transistors M1 and M2 is thus approximately −0.24 V in such an example implementation, which assures that transistors M1 and M2 are non-conductive in the default state. But transistor M1 is switched on to conduct current when the divided version of the positive amplifier output signal rises above a threshold voltage such that the gate-to-source voltage of transistor M1 exceeds its transistor threshold voltage. Similarly, transistor M2 is switched on to conduct current when the divided version of the negative amplifier output voltage rises above the threshold voltage such that the gate-to-source voltage of transistor M2 exceeds its transistor threshold voltage.

The amount of current that transistor M1 or transistor M2 will conduct when its transistor threshold voltage is satisfied depends upon their drain-to-source bias voltage. To bias the drain voltage of transistors M1 and M2 and thus control the current conducted, threshold voltage detector 102 includes a drain bias circuit formed by a differential amplifier 170, an NMOS transistor M4, a variable current source 145, a resistor R5, and a current source 135. The source of transistor M4 connects to the drains of transistors M1 and M2. Current source 135 couples between the source of transistor M4 and ground to bias transistor M4 with a source current. With transistor M4 biased with the source current, a feedback loop is formed by differential amplifier 170 and transistor M4. In particular, current source 145 drives a current into a first terminal of resistor R5, which has a second terminal coupled to ground. The first terminal of resistor R5 connects to a first input of differential amplifier 170. The drains of transistors M1 and M2 as well as the source of transistor M4 connect to a second input of differential amplifier 170. An output of differential amplifier 170 drives the gate of transistor M4. The feedback loop formed by differential amplifier 170 and transistor M4 thus functions to keep the drain voltage of transistors M1 and M2 equal to the voltage across resistor R5. In one implementation, the current from current source 145 and the resistance for resistor R5 may be configured so that the voltage across resistor R5 is approximately one volt so that the drain voltage of transistors M1 and M2 is also approximately one volt, but it will be appreciated that a smaller or larger drain voltage bias may be applied in alternative implementations.

Regardless of the exact bias voltages applied, biasing the gate, drain, and source voltages for transistors M1 and M2 allows a user to define the peak threshold voltage in the amplifier output signal that will trigger either of transistors M1 and M2 to conduct a defined amount of current, which is also denoted herein as a detection current. This detection current is mirrored by a current mirror such as formed by a PMOS transistor P2 and a PMOS transistor P3. Transistor P2 is diode connected and thus has its drain connected to its gate. A drain of transistor P2 connects to the drain of transistor M4. A source for each of transistors P2 and P3 connects to a power supply node for a power supply voltage. The gate of transistor P2 connects to the gate of transistor P3 to complete the current mirror. It will be appreciated that each of transistors P2 and P3 may be repeated in series in alternative current mirror implementations. Regardless of how many transistors are used to form the current mirror, the current mirror mirrors the detection current into a mirrored current. The mirrored current is driven into a relatively-high impedance node 151. A current source such as a variable current source 140 discharges current from node 151 into ground. By controlling the amount of current discharged by variable current source 140, a controller may control the delay necessary for the mirrored current to charge node 151 to the trip voltage of an inverter 155. Inverter 155 is in series with another inverter 160 to produce the binary output signal. The binary output signal will thus be asserted when the mirrored current charges node 151 above the trip point or threshold voltage for inverter 155. The output of inverter 155 will then be discharged, which causes inverter 160 to assert the binary output signal.

As the input signal amplitude being amplified by amplifier 165 reduces, the threshold voltage detector 102 is no longer triggered such that whichever transistor M1 or M2 that had been conducting the detection current stops conducting. The binary output signal will then again be discharged to its default state. With regard to a single assertion of the binary output signal as triggered by peak detector 100, this assertion may be due to noise in the amplifier output signal. To distinguish between noise and actual peaks in the amplifier output signal, peak detector 100 may include a counter such as a ripple counter 150. Ripple counter 150 counts the number of assertions of the binary output signal as produced by inverters 155 and 160 within a reset period to provide a count. At the end of the reset period, ripple counter 150 resets its count. But if the count exceeds a threshold count (e.g., a programmable threshold count), ripple counter 150 asserts an alarm signal so that the gain of power amplifier 165 may be reduced accordingly. In alternative implementations, other types of counters may be used such as a synchronous counter. In some embodiments, a duration or length of time during which the divided output of power amplifier 165 exceeds the threshold voltage is used to determine if the alarm signal is asserted in lieu of using a count.

Example implementations of a divider, threshold voltage detector, current mirror, counter, and bias circuits are described above. Those of skill in the art will appreciate that these implementations are merely illustrative and that other implementations may be used. For example, any circuit or connection that couples a voltage at an output of an amplifier (e.g., the power amplifier 165) to an input of a threshold voltage detector, and/or that scales down such voltage, may be used in place of the capacitive voltage divider 101. In some embodiments, the current mirror is omitted and an output of the threshold voltage detector is directly connected or connected via another circuit to an input of a circuit configured to assert a binary or pulse signal or other signal that can be counted. In some embodiments, the counter is configured to count a rising and/or falling edge of a signal from the threshold voltage detector and/or current mirror (e.g., as generated at the node 151). In some embodiments, the bias circuits (e.g., the loops therein) illustrated in FIG. 1 track process and temperature and minimize variation in operation due to supply fluctuations.

In some embodiments, all of the elements illustrated in FIG. 1 are implemented in an integrated circuit (IC). For example, the amplifier 165 may be configured to output signals having a frequency above approximately 20 GHz (e.g., millimeter wave (mmW) or FR2 signals), and the integrated circuit may therefore be configured as a mmW IC. In some such embodiments, the alarm signal may be provided to a component external to the IC (and potentially external to a module within which the IC is implemented). In some embodiments, the counter and/or the inverters (or other circuit elements configured to output a binary signal) are implemented external to the IC.

Figure 2:
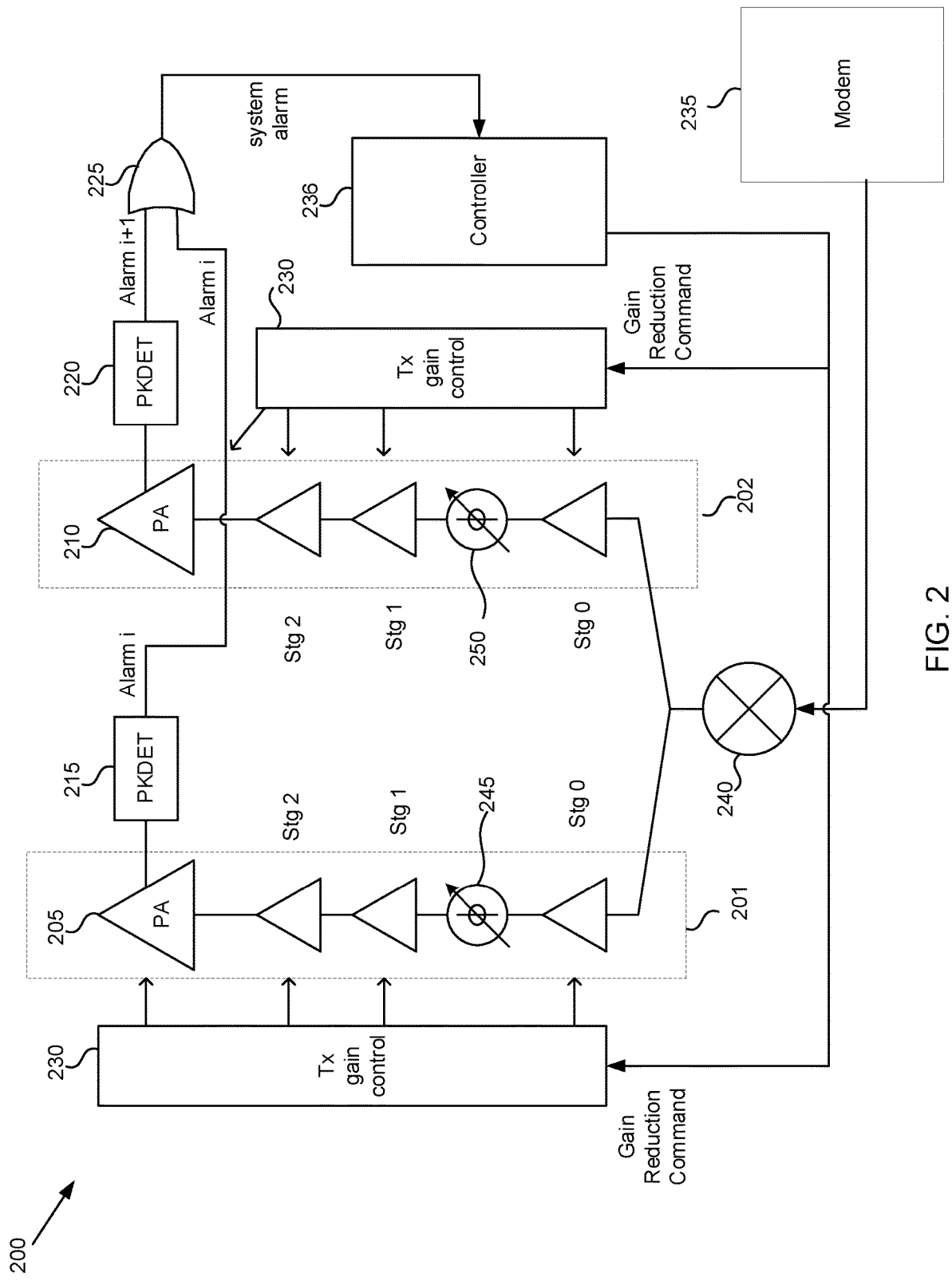
FIG. 2. illustrates a power amplifier protection system in accordance with an aspect of the disclosure.

A plurality of peak detectors may be integrated within an amplifier protection system 200 as shown in FIG. 2 to protect a plurality of power amplifiers. Each power amplifier is the final amplifier in a corresponding transmit amplifier chain. For example, a power amplifier 205 is the fourth amplifier in an amplifier chain 201 that begins with a stage (stg) 0 amplifier and precedes through a stage 1 and a stage 2 amplifier to drive power amplifier 205. Similarly, a power amplifier 210 is the fourth amplifier in an amplifier chain 202 that begins with a stage (stg) 0 amplifier and precedes through a stage 1 and a stage 2 amplifier to drive power amplifier 210. One or both of power amplifiers 205 and 210 may be an example of power amplifier 165 (FIG. 1).

Each amplifier chain functions to amplify an RF input signal such as generated by a mixer 240. In a direct conversion architecture, mixer 240 mixes a baseband input signal such as produced by a modem 235 to form the RF input signal. In a heterodyne architecture, mixer 240 may instead upconvert an intermediate frequency signal to form the RF input signal. Amplifier protection system 200 may be incorporated into a beamforming transmitter. To apply a different phasing to the RF signal being amplified by each amplifier chain, amplifier chain 201 includes a phase shifter 245 whereas amplifier chain 202 includes a phase shifter 250.

In general, a beamforming transmitter may have more than the two amplifier chains. It will thus be appreciated that amplifier chains 201 and 202 are merely representative and may be part of a larger plurality of amplifier chains. For example, amplifier chain 201 may be deemed as being the ith chain in such a plurality (i being a positive integer) whereas amplifier chain 202 may be deemed as the (i+1)th chain. Each chain has its own peak detector. For example, power amplifier 205 in chain 201 is monitored by a peak detector 215 that controls an ith alarm signal (Alarm i). Similarly, a peak detector 220 monitors power amplifier 210 in chain 202 to control an (i+1)th alarm signal designated as Alarm i+1. One or both of the peak detectors 215 and 220 may be an example of peak detector 100 (FIG. 1).

To monitor whether any alarm signal is asserted, amplifier protection system 200 may include a logic gate such as an OR gate 225. OR gate 225 functions to assert a system alarm signal whenever any monitored alarm signal is asserted. Other circuits for accumulating alarms from respective amplifier chains and for asserting a system alarm signal may be implemented. A controller 236 (which may be integrated with modem 235 in some implementations) responds to the assertion of the system alarm signal by asserting a gain reduction command. The amplifiers in each amplifier chain have their gain controlled by a corresponding gain control circuit 230, which responds to the assertion of the gain reduction command by reducing a gain of all the amplifiers in the corresponding amplifier chain. In alternative implementations, just a subset of the amplifiers in each amplifier chain may have their gain reduced in this fashion. Note that controller 236 functions to reduce the gain for all the active amplifier chains in some embodiments. This is advantageous with regard to not disturbing any beamforming and/or beamsteering. For example, other methods may disable or adjust the gain or bias of one or a subset of power amplifiers in a phased array, potentially without reference to the operation of other power amplifiers in the array. Aspects described herein may provide a unified power control which considers operation of all transmit chains in a phased array so as to maintain proper beamforming and/or beamsteering operation. For example, a primary direction of a beam may be maintained, and/or a concentration of transmitted energy may be focused/maintained such that communications with a receiving device is not severed or significantly disturbed. In some embodiments, gain is uniformly reduced across all power amplifiers in the phased array. In some embodiments, gain is reduced to one or more power amplifiers in the array without adjusting a bias of the respective power amplifier. In some embodiments, the phase shifter(s) in a transmit chain (e.g., 245, 250) may be adjusted (e.g., by the controller 236) when the gain is reduced. In addition, controller 236 may coordinate the assertion of the gain reduction command so that the gain reduction is not applied in the middle of a current symbol transmission but instead at the beginning of a subsequent symbol.

In some embodiments, all of the elements illustrated in FIG. 2 except the modem 235 are implemented in an IC, for example a mmW IC. In some embodiments, the controller 236 and/or the logic gate (225) are implemented external to the IC.

Figure 3:
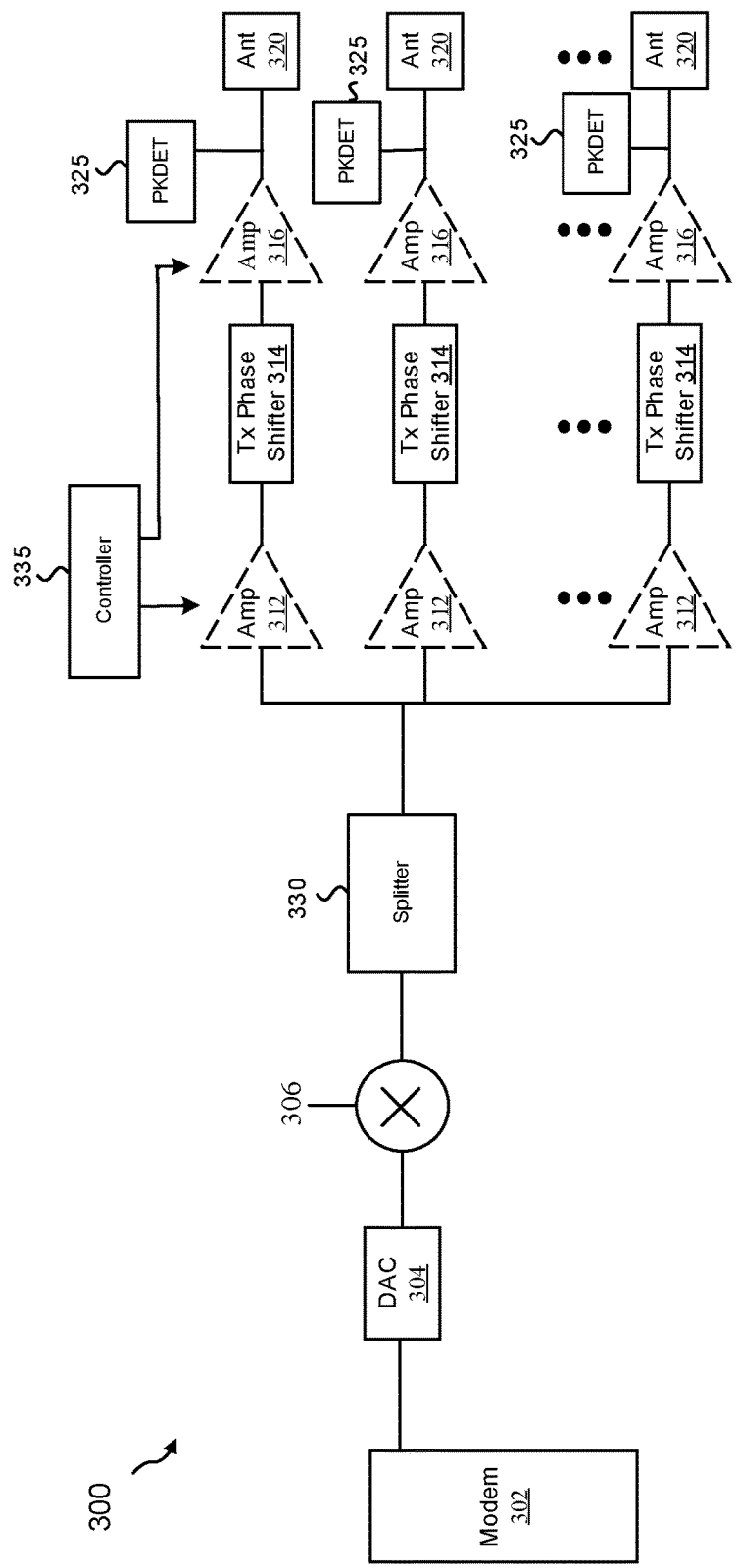
FIG. 3 illustrates a cellular telephone transmitter with a power amplifier protection system in accordance with an aspect of the disclosure.

An example beamsteering RF transceiver for a cellular telephone 300 is shown in FIG. 3 that includes an amplifier protection system with a peak detection as disclosed herein. The architecture includes a modem (modulator/demodulator) 302, a digital to analog converter (DAC) 304, a mixer 306, and a splitter 330. Mixer 306 upconverts a baseband signal to RF. In alternative embodiments, a heterodyne mixer array may be used instead that first upconverts from baseband to an intermediate frequency. The transceiver includes a plurality of amplifier chains. Each amplifier chain includes a first amplifier 312, a phase shifter 314, and a power amplifier 316. Transmission lines or other waveguides, wires, traces, or the like are shown connecting the various components to illustrate how signals to be transmitted may travel between components. Each amplifier chain drives a corresponding antenna (or antennas) 320. The antenna elements 320 may include patch antennas or other types of antennas arranged in a linear, two dimensional, or an alternative pattern. A spacing between antenna elements 320 may be such that signals with a desired wavelength transmitted separately by the antenna elements 320 may interact or interfere (e.g., to form a desired beam). For example, given an expected range of wavelengths or frequencies, the spacing may provide a quarter wavelength, half wavelength, or other fraction of a wavelength of spacing between neighboring antenna elements 320 to allow for interaction or interference of signals transmitted by the separate antenna elements 320 within that expected range.

The modem 302 processes and generates digital baseband signals and may also control operation of the DAC 304, first amplifiers 312, phase shifters 314, and/or the power amplifiers 316 to transmit signals via one or more or all of the antenna elements 320. The modem 302 may process signals and control operation in accordance with a communication standard such as 5G or according to an IEEE 802 standard (e.g., WiFi). The DAC 304 may convert digital baseband signals received from the modem 302 (and that are to be transmitted) into analog baseband signals. The mixer 306 upconverts analog baseband signals to analog RF signals.

In the illustrated architecture, signals upconverted by the mixer 306 are split or duplicated into multiple signals by the splitter 330. The splitter 330 in cellular telephone 300 splits the RF signal into a plurality of identical or nearly identical RF signals. In other examples, the split may take place with any type of signal including with baseband digital, baseband analog, or IF analog signals. Each of these signals may correspond to an antenna element 320 and the signal travels through and is processed by amplifiers 312, 316, phase shifters 314, and/or other elements to be transmitted by the corresponding antenna element 320. In one example, the splitter 330 may be an active splitter that is connected to a power supply and provides some gain so that RF signals exiting the splitter 330 are at a power level equal to or greater than the signal entering the splitter 330. In another example, the splitter 330 is a passive splitter that is not connected to a power supply and the RF signals exiting the splitter 330 may be at a power level lower than the RF signal entering the splitter 330.

After being split by the splitter 330, the resulting RF signals may enter an amplifier, such as a first amplifier 312, or a phase shifter 314 corresponding to an antenna element 320. The first amplifiers 312 and power amplifiers 316 are illustrated with dashed lines because one or both of them might not be necessary in some implementations. By way of example, if the splitter 330 is an active splitter, the first amplifier 312 may not be used. Each phase shifter 314 may provide a configurable phase shift or phase offset to a corresponding RF signal to be transmitted. The phase shifter 314 could be a passive phase shifter not directly connected to a power supply. Passive phase shifters might introduce some insertion loss. Each power amplifier 316 may boost the signal to compensate for the insertion loss. Each phase shifter 314 may be an active phase shifter connected to a power supply such that the active phase shifter provides some amount of gain or prevents insertion loss. The settings of each of the phase shifters 314 are independent meaning that each can be set to provide a desired amount of phase shift. In some embodiments, the phase shifters may be implemented such that a phase of a local oscillator signal coupled to an upconversion mixer in the amplifier chain is adjusted instead of the phase being adjusted in the signal path. For example, the mixer 306 may be configured to upconvert a baseband signal to an intermediate frequency signal, and an additional mixer (not illustrated) may be implemented in each amplifier chain to upconvert the intermediate frequency signal to a respective radio frequency (e.g., mmW) signal. The modem 302 may have at least one control line (not illustrated) connected to each of the phase shifters 314 to configure the phase shifters 314 to provide a desired amounts of phase shift or phase offset between antenna elements 320.

A peak detector 325 is associated with each power amplifier 316 and functions as discussed herein to monitor its power amplifier's output signal(s) to determine whether an alarm signal should be asserted. Should one of the peak detectors 325 assert its alarm signal (or one or more of the peak detectors assert more than a threshold number of alarm signals during a reset period), a controller 335 functions to assert a gain reduction command to reduce the gain of the first amplifiers 312 and/or power amplifiers 316. Gain control circuits 230 and OR gate 225 are not shown in FIG. 3 for illustration clarity but may be included.

The modem 302 may be an example of the modem 235 (FIG. 2). The mixer 306 may be an example of the mixer 240. The splitter 330 may be configured as illustrated in FIG. 2. One or more of the amplifiers 312 may be an example of the stg 0 amplifier. One or more of the phase shifters 314 may be an example of the phase shifter 245, 250. One or more of the amplifiers 316 may be an example of the amplifier 205, 210. One or more of the peak detectors 325 may be an example of the peak detector 215, 220. The controller 335 may be an example of the controller 236.

In some embodiments, all of the elements 306-335 are implemented together in a single module. In other embodiments, the mixer 306 and/or the splitter 330 are implemented external to the module (for example, when each amplifier chain includes a respective mixer, as described above). In some embodiments, the controller 335 and/or a portion thereof is implemented external to the module. In some embodiments, the elements 312-316 and 325 are implemented in an IC within the module. In other embodiments, the IC is not included in a module with the antennas 320. The elements 306, 330, and/or 335 may be included in the IC.

Figure 4:
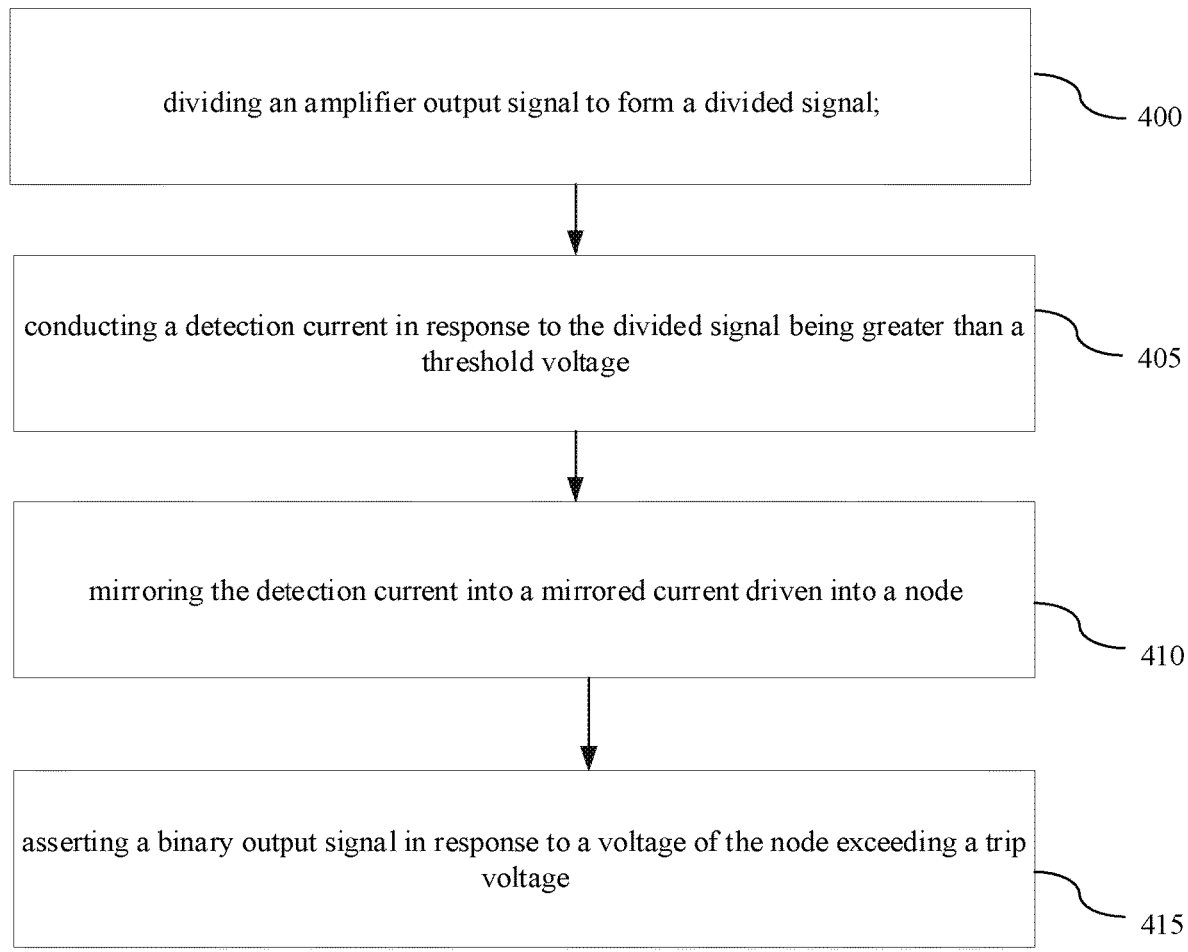
FIG. 4 is a flowchart of an example peak detection method in accordance with an aspect of the disclosure.

An example method of peak detection will now be discussed with reference to the flowchart of FIG. 4. The method includes an act 400 of dividing an amplifier output signal to form a divided signal. The operation of capacitive divider 101 is an example of act 400. In addition, the method includes an act 405 of conducting a detection current in response to the divided signal being greater than a threshold voltage. The conduction of the detection current by either of transistor M1 and M2 in threshold voltage detector 102 is an example of act 405. The method also includes an act 410 of mirroring the detection current into a mirrored current driven into a node. The mirroring of the detection current into node 151 is an example of act 410. Finally, the method includes an act 415 of asserting a binary output signal in response to a voltage of the node exceeding a trip voltage. The assertion of the binary output signal by inverters 155 and 160 is an example of act 415.

The disclosure will now be summarized in the following example clauses:

Clause 1. A peak detector, comprising:
 a voltage divider configured to divide an amplifier output signal into a divided signal;
 a threshold voltage detector configured to conduct a detection current in response to the divided signal being greater than a threshold voltage;
 a current mirror configured to mirror the detection current into a mirrored current and configured to drive the mirrored current into a node; and
 at least one inverter configured to invert a voltage of the node to produce a binary output signal.

Clause 2. The peak detector of clause 1, further comprising:
 a counter configured to count binary transitions in the binary output signal to form a count and configured to assert a peak detector alarm signal in response to the count exceeding a peak detection threshold count.

Clause 3. The peak detector of clause 2, wherein the counter is a ripple counter.

Clause 4. The peak detector of any of clauses 2-3, further comprising:
 a controller configured to command an amplifier to reduce a gain in response to an assertion of the peak detector alarm signal.

Clause 5. The peak detector of any of clauses 1-4, wherein the threshold voltage detector comprises:
 a first transistor having a gate configured to be driven by the divided signal.

Clause 6. The peak detector of clause 5, the threshold voltage detector further including a source bias circuit configured to bias a source of the first transistor, a gate bias circuit configured to bias a gate of the first transistor, and a drain bias circuit configured to bias a drain of the first transistor.

Clause 7. The peak detector of clause 6, wherein the source bias circuit comprises:
 a first current source configured to drive a resistor with a first current to develop a source bias voltage at a terminal of the resistor;
 a second transistor;
 a second current source configured to drive a second current into a drain of the second transistor; and
 a differential amplifier having a first input coupled to the terminal of the resistor, a second input coupled to the source of the first transistor; and an output coupled to a gate of the second transistor, wherein the differential amplifier and the second transistor are configured to form a feedback loop to bias the source of the first transistor with the source bias voltage.

Clause 8. The peak detector of clause 7, wherein the first transistor is an n-type-metal-oxide-semiconductor (NMOS) transistor, and the second transistor is a p-type-metal-oxide-semiconductor (PMOS) transistor.

Clause 9. The peak detector of any of clauses 6-7, wherein the first current source is a variable current source.

Clause 10. The peak detector of any of clauses 6-9, wherein the gate bias circuit comprises:
a first current source configured to drive a first resistor with a first current to develop a bias voltage at a terminal of the first resistor,
a second transistor;
a second current source configured to drive a second current into a drain of the second transistor; and
a differential amplifier having a first input coupled to the terminal of the first resistor, a second input coupled to a drain of the second transistor; and an output coupled to a gate of the second transistor, wherein the differential amplifier and the second transistor are configured to form a feedback loop to bias the gate of the first transistor with a gate bias voltage.

Clause 11. The peak detector of clause 10, wherein the gate bias circuit further comprises a second resistor coupled between the gate of the first transistor and the gate of the second transistor.

Clause 12. The peak detector of any of clause 6-11, wherein the drain bias circuit comprises:
a first current source configured to drive a resistor with a first current to develop a drain bias voltage at a terminal of the resistor,
a second transistor having a source coupled to a drain of the first transistor;
a second current source configured to drive a second current into ground from the source of the second transistor; and
a differential amplifier having a first input coupled to the terminal of the resistor, a second input coupled to the drain of the first transistor; and an output coupled to a gate of the second transistor, wherein the differential amplifier and the second transistor are configured to form a feedback loop to bias the drain of the first transistor with the drain bias voltage.

Clause 13. The peak detector of any of clauses 1-12, wherein the threshold voltage detector comprises an NMOS transistor configured to conduct the detection current, and wherein the current mirror comprises a diode-connected first PMOS transistor having a gate connected to a gate of a second PMOS transistor.

Clause 14. The peak detector of clause 13, wherein a drain of the second PMOS transistor is coupled to the node.

Clause 15. The peak detector of any of clauses 1-14, wherein the at least one inverter comprises a pair of inverters.

Clause 16. A method of peak detection for an amplifier, comprising:
dividing an amplifier output signal from the amplifier to form a divided signal;
conducting a detection current in response to the divided signal being greater than a threshold voltage;
mirroring the detection current into a mirrored current driven into a node; and
asserting a binary output signal in response to a voltage of the node exceeding a trip voltage.

Clause 17. The method of clause 16, further comprising:
biasing a source, a gate, and a drain of a transistor to form a biased transistor, wherein conducting the detection current comprises conducting the detection current through the biased transistor.

Clause 18. The method of any of clauses 16-17, further comprising:
counting binary transitions of the binary output signal to form a count; and
asserting an alarm signal in response to the count exceeding a threshold count.

Clause 19. The method of clause 18, further comprising:
reducing a gain of the amplifier in response to an assertion of the alarm signal.

Clause 20. The method of clause 19, further comprising reducing a gain of additional amplifiers in response to the assertion of the alarm signal.

Clause 21. A transmitter, comprising:
a plurality of antennas;
a plurality of power amplifiers corresponding to the plurality of antennas, each power amplifier configured to drive a respective one of the antennas with an amplified RF output signal;
a plurality of peak detectors corresponding to the plurality of power amplifiers, each peak detector being configured to generate an alarm signal in response to the corresponding power amplifier's amplified RF output signal being greater than a peak threshold; and
a controller configured to reduce a gain for at least one of the power amplifiers responsive to an assertion of any of the alarm signals.

Clause 22. The transmitter of clause 21, further comprising a logic gate configured to process the alarm signals to generate a system alarm, wherein the controller is further configured to reduce the gain of each of the power amplifiers in response to an assertion of the system alarm Clause 23. The transmitter of clause 22, wherein the transmitter is a cellular telephone transmitter and the logic gate is an OR gate.

Clause 24. The transmitter of any of clauses 22-23, further comprising a plurality of amplifier chains, each amplifier chain including a respective one of the power amplifiers and at least one additional amplifier, wherein the controller is further configured to reduce the gain of each at least one additional amplifier responsive to the assertion of the system alarm.

Clause 25. The transmitter of any of clauses 22-24, wherein the transmitter is beamsteering transmitter, each amplifier chain further including a phase-shifter.

Clause 26. The transmitter of clause 24, wherein each at least one additional amplifier comprises a plurality of additional amplifiers.

Clause 27. The transmitter of any of clauses 21-26, wherein each power amplifier is a differential power amplifier.

Clause 28. The transmitter of any of clauses 22-26, wherein each peak detector includes a threshold voltage detector configured to pulse a detection current in response to the amplified RF output signal of the corresponding power amplifier being greater than a current threshold and includes a counter configured to count how many times the detection current is pulsed to form a count, the counter being further configured to assert the peak detector's alarm signal in response to the count exceeding a threshold count.

Clause 29. The transmitter of any of clauses 21-28, wherein the controller is configured to reduce the gain for all of the plurality of power amplifiers uniformly in response to the assertion of any of the alarm signals.

Clause 30. The transmitter of any of clauses 21-28, wherein the controller is configured to reduce the gain for multiple power amplifiers in response to the assertion of any of the alarm signals.

Clause 31. The transmitter of any of clauses 21-30, wherein each of the plurality of peak detectors is connected to a drain of a transistor which implements an amplification function of the respective power amplifier.

Clause 32. The transmitter of clause 21, further comprising an accumulator coupled to outputs of the plurality peak detectors and configured to assert a system alarm based on one or more of the alarm signals, wherein the controller is configured to reduce the gain of the at least one power amplifier in response to an assertion of the system alarm.
Clause 33. The transmitter of any of clauses 21-32, wherein the controller is configured to reduce the gain of the at least one power amplifier while maintaining a beamforming operation in response to an assertion of the system alarm.
Clause 34. The peak detector of any of clauses 1-15, wherein the voltage divider is connected to a drain of a transistor configured to amplify a signal in the amplifier.

As those of some skill in this art will by now appreciate and depending on the particular application at hand, many modifications, substitutions and variations can be made in and to the materials, apparatus, configurations and methods of use of the devices of the present disclosure without departing from the scope thereof In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A peak detector, comprising:
   a voltage divider configured to divide an amplifier output signal into a divided signal;
   a threshold voltage detector configured to conduct a detection current in response to the divided signal being greater than a threshold voltage;
   a current mirror configured to mirror the detection current into a mirrored current and configured to drive the mirrored current into a node; and
   at least one inverter configured to invert a voltage of the node to produce a binary output signal,
   wherein the threshold voltage detector comprises
     a first transistor having a gate configured to be driven by the divided signal,
     a source bias circuit configured to bias a source of the first transistor,
     a gate bias circuit configured to bias a gate of the first transistor, and
     a drain bias circuit configured to bias a drain of the first transistor,
   wherein the source bias circuit comprises:
     a first current source configured to drive a resistor with a first current to develop a source bias voltage at a terminal of the resistor,
     a second transistor;
     a second current source configured to drive a second current into a drain of the second transistor; and
     a differential amplifier having a first input coupled to the terminal of the resistor, a second input coupled to the source of the first transistor; and an output coupled to a gate of the second transistor, wherein the differential amplifier and the second transistor are configured to form a feedback loop to bias the source of the first transistor with the source bias voltage.

2. The peak detector of claim 1, further comprising:
   a counter configured to count binary transitions in the binary output signal to form a count and configured to assert a peak detector alarm signal in response to the count exceeding a peak detection threshold count.

3. The peak detector of claim 2, wherein the counter is a ripple counter.

4. The peak detector of claim 2, further comprising:
   a controller configured to command the amplifier to reduce a gain in response to an assertion of the peak detector alarm signal.

5. The peak detector of claim 1, wherein the first transistor is an n-type-metal-oxide-semiconductor (NMOS) transistor, and the second transistor is a p-type-metal-oxide-semiconductor (PMOS) transistor.

6. The peak detector of claim 1, wherein the first current source is a variable current source.

7. The peak detector of claim 1, wherein the first transistor comprises an NMOS transistor configured to conduct the detection current, and wherein the current mirror comprises a diode-connected first PMOS transistor having a gate connected to a gate of a second PMOS transistor.

8. The peak detector of claim 7, wherein a drain of the second PMOS transistor is coupled to the node.

9. The peak detector of claim 1, wherein the at least one inverter comprises a pair of inverters.

10. A peak detector, comprising:
    a voltage divider configured to divide an amplifier output signal into a divided signal;
    a threshold voltage detector configured to conduct a detection current in response to the divided signal being greater than a threshold voltage;
    a current mirror configured to mirror the detection current into a mirrored current and configured to drive the mirrored current into a node; and
    at least one inverter configured to invert a voltage of the node to produce a binary output signal,
    wherein the threshold voltage detector comprises
      a first transistor having a gate configured to be driven by the divided signal,
      a source bias circuit configured to bias a source of the first transistor,
      a gate bias circuit configured to bias a gate of the first transistor, and
      a drain bias circuit configured to bias a drain of the first transistor,
    wherein the gate bias circuit comprises:
      a first current source configured to drive a first resistor with a first current to develop a bias voltage at a terminal of the first resistor;
      a second transistor;
      a second current source configured to drive a second current into a drain of the second transistor; and
      a differential amplifier having a first input coupled to the terminal of the first resistor, a second input coupled to the drain of the second transistor; and an output coupled to a gate of the second transistor, wherein the differential amplifier and the second transistor are configured to form a feedback loop to bias the gate of the first transistor with a gate bias voltage equal to the bias voltage at the terminal of the first resistor.

11. The peak detector of claim 10, further comprising:
    a counter configured to count binary transitions in the binary output signal to form a count and configured to assert a peak detector alarm signal in response to the count exceeding a peak detection threshold count.

12. The peak detector of claim 11, wherein the counter is a ripple counter.

13. The peak detector of claim 11, further comprising:
    a controller configured to command the amplifier to reduce a gain in response to an assertion of the peak detector alarm signal.

14. The peak detector of claim 10, wherein the gate bias circuit further comprises a second resistor coupled between the gate of the first transistor and the gate of the second transistor.

15. The peak detector of claim 10, wherein the first transistor comprises an NMOS transistor configured to conduct the detection current, and wherein the current mirror comprises a diode-connected first PMOS transistor having a gate connected to a gate of a second PMOS transistor.

16. The peak detector of claim 15, wherein a drain of the second PMOS transistor is coupled to the node.

17. The peak detector of claim 10, wherein the at least one inverter comprises a pair of inverters.

18. A peak detector, comprising:
a voltage divider configured to divide an amplifier output signal into a divided signal;
a threshold voltage detector configured to conduct a detection current in response to the divided signal being greater than a threshold voltage;
a current mirror configured to mirror the detection current into a mirrored current and configured to drive the mirrored current into a node; and
at least one inverter configured to invert a voltage of the node to produce a binary output signal,
wherein the threshold voltage detector comprises
a first transistor having a gate configured to be driven by the divided signal,
a source bias circuit configured to bias a source of the first transistor,
a gate bias circuit configured to bias a gate of the first transistor, and
a drain bias circuit configured to bias a drain of the first transistor,
wherein the drain bias circuit comprises:
a first current source configured to drive a resistor with a first current to develop a drain bias voltage at a terminal of the resistor,
a second transistor having a source coupled to a drain of the first transistor;
a second current source configured to drive a second current into ground from the source of the second transistor; and
a differential amplifier having a first input coupled to the terminal of the resistor, a second input coupled to the drain of the first transistor; and an output coupled to a gate of the second transistor, wherein the differential amplifier and the second transistor are configured to form a feedback loop to bias the drain of the first transistor with the drain bias voltage.

19. The peak detector of claim 18, further comprising:
a counter configured to count binary transitions in the binary output signal to form a count and configured to assert a peak detector alarm signal in response to the count exceeding a peak detection threshold count.

20. The peak detector of claim 19, wherein the counter is a ripple counter.

21. The peak detector of claim 19, further comprising:
a controller configured to command the amplifier to reduce a gain in response to an assertion of the peak detector alarm signal.

22. The peak detector of claim 18, wherein the first transistor comprises an NMOS transistor configured to conduct the detection current, and wherein the current mirror comprises a diode-connected first PMOS transistor having a gate connected to a gate of a second PMOS transistor.

23. The peak detector of claim 22, wherein a drain of the second PMOS transistor is coupled to the node.

24. The peak detector of claim 18, wherein the at least one inverter comprises a pair of inverters.

* * * * *